INVENTOR.
Richard J. Harasek,
BY
Mueller & Aichele
Att'ys.

July 4, 1961 R. J. HARASEK 2,991,356

RADIO RECEIVER

Original Filed Jan. 31, 1955 2 Sheets-Sheet 2

INVENTOR.

Richard J. Harasek,

BY

Mueller & Aichele

Att'ys.

2,991,356
RADIO RECEIVER
Richard J. Harasek, Chicago, Ill., assignor to Motorola, Inc., Chicago, Ill., a corporation of Illinois
Continuation of application Ser. No. 484,953, Jan. 31, 1955. This application Feb. 6, 1959, Ser. No. 791,775
15 Claims. (Cl. 250—16)

This invention relates to radio receivers and the like, and more particularly, though not exclusively, to an improved construction for a radio receiver of the inexpensive miniature table model type. This is a continuation of my copending application Serial No. 484,953, filed January 31, 1955, now abandoned.

In the past, miniature table model type radio receivers have been constructed by mounting the various electrical and electronic components on a sturdy metal chassis, and by interconnecting these components by jumper leads and manually soldering the jumpers to the components. The chassis assembly was then mounted in a cabinet and affixed thereto by a multiplicity of suitable fastening members such as screws or the like. A speaker was also fastened to the cabinet by suitable fastening members, knobs were affixed to the control shafts and a back panel usually secured by screws or the like. It is evident that such a construction entails many manual operations in assembling the radio, and that these operations all contribute to raising the cost of the finished article.

The advent of printed or plated circuit assemblies has simplified the construction of radio receivers, but receivers utilizing such assemblies still have required a large number of manual and time-consuming operations in assembling the plated panel assemblies and other components of the radio into the cabinet.

A principal object of the present invention is to provide an improved electronic unit, such as a radio receiver of the miniature table model type, that can be assembled speedily and simply so as to facilitate the manufacturing process.

Another object of the invention is to provide such an improved radio receiver in which the various components comprising the receiver are mounted and secured in a cabinet in a simple and inexpensive manner which requires a minimum of fastening members.

A feature of the invention is the provision of an improved electronic unit, such as a radio receiver, which is constructed so that each component thereof serves to hold and mount another component within a cabinet so as to obviate the need for a multiplicity of extraneous fastening members for holding the unit in an assembled condition.

Stated another way, a feature of the invention is the provision of an improved electronic unit which is constructed so that each component thereof engages another component within a cabinet in overlying manner so as to eliminate the necessity for a plurality of fastening members and to expedite the assembling process.

The above and other features of the invention which are believed to be new are set forth with particularity in the appended claims. The invention itself, however, together with further objects and advantages thereof may best be understood by reference to the following description when taken in conjunction with the accompanying drawings in which:

Figures 1, 2, 3:
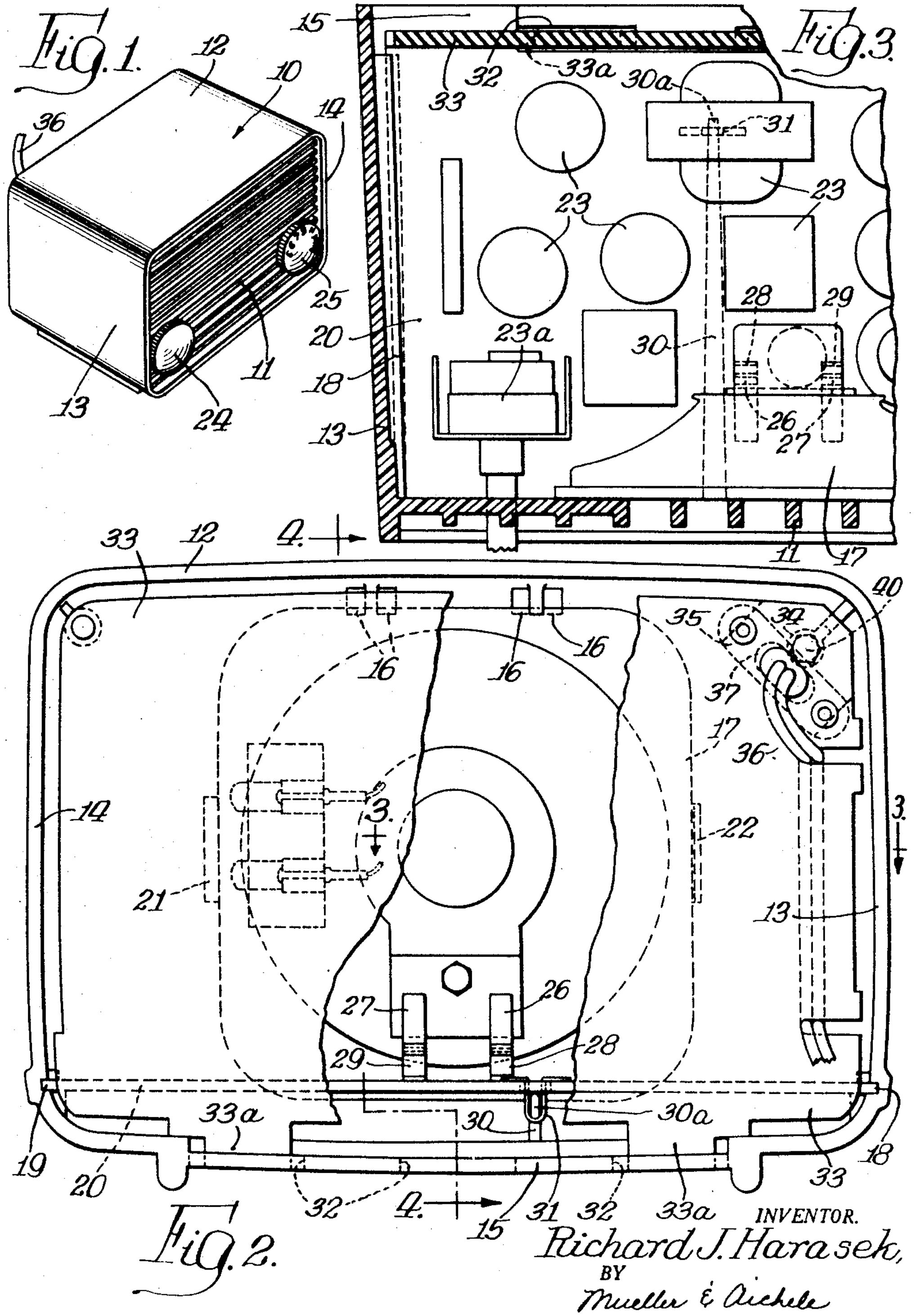
FIG. 1 is a perspective view of a typical table model radio receiver with which the present invention is primarily concerned.
FIG. 2 is a rear view of the radio.
FIG. 3 is a top view of a portion of the radio, with a section being taken through the cabinet to show the component parts supported therein.

The radio receiver of the invention comprises a molded cabinet having a front panel, and further having a pair of sides and a top and a bottom all extending rearwardly from said front panel, each of the sides having a groove therein extending rearwardly thereacross from the front panel and parallel to the bottom. A dog is supported by the top adjacent the front panel but spaced therefrom, and a speaker is disposed in facing coacting relation with the front wall and having an upper rim extending between the dog and the front panel to be supported by the dog. A plated circuit panel assembly including a flat insulating panel, is supported in the grooves of the sides, and the insulating panel has a forward edge engaging the speaker to hold the speaker in place against the front panel. A pair of contacts is mounted on the speaker, and a corresponding pair of contacts is mounted on the panel assembly, and the latter contacts are adapted to engage respective ones of the contacts on the speaker when the insulating panel is in place, so as to establish electrical contact from the panel assembly to the speaker. A guide member is formed in the bottom of the cabinet, and this member extends parallel to the sides rearwardly from the front panel. The end of the guide member is formed into a rearwardly extending latching portion; and a latch member or strap is affixed to the under side of the insulating panel for engaging the latching portion of the guide. The bottom of the cabinet has a series of slots formed adjacent the rear edge thereof, and the unit includes a rear panel having projections extending into these slots. The rear panel engages the rear edge of the insulating panel to hold the latter panel in place. Finally, means is provided for fastening the upper portion of the rear panel to the cabinet.

Reference is now made to the drawings for a better understanding of the invention. The radio receiver of the invention includes a molded cabinet 10 having a front panel 11, a top 12, a pair of sides 13 and 14, and a bottom 15. The cabinet preferably is of molded construction with the sides, top and bottom extending rearwardly from the front panel to form an integral unit.

A series of dogs 16 are formed in the top of this cabinet to depend therefrom adjacent the front panel but spaced therefrom. A speaker 17 is disposed in coacting, facing relation with the front panel, and it has an upper rim extending between dogs 16 and the front panel to be supported thereby. The front panel is preferably louvered so that sound originating from the speaker may emanate outwardly from the cabinet.

The side walls 13 and 14 have a pair of grooves 18 and 19 respectively formed therein extending rearwardly from the front panel 11 and parallel to the bottom 15, the grooves being disposed adjacent the bottom 15 of the cabinet. A printed or plated circuit panel assembly, including a flat insulating panel 20, is supported in grooves 18 and 19 with the insulating panel adjacent but spaced from bottom 15 and essentially parallel thereto. The front edge of panel 20 engages the lower rim of speaker 17 to hold the speaker in place when the panel is positioned within the grooves. The front panel also has a pair of guides 21, 22 formed therein which assist in positioning the speaker against that panel.

The plated circuit panel assembly supports the various electrical and electronic components 23 of the radio receiver, including manually controlled components such as unit 23*a* which has a control shaft adapted to extend through the front panel 11 when the panel 20 is in place, and such control shafts receive control knobs, such as knobs 24 and 25 shown in FIG. 1.

Speaker 17 has a pair of contacts 26, 27 supported thereon, and these contacts engage corresponding resilient contacts 28, 29 on the plated circuit panel assembly when that assembly is in place. In this manner, electrical connection is established between the plated circuit assembly and the speaker automatically when the panel is inserted into the cabinet.

The assembly also includes a guide member 30 formed in the bottom, and this member extends rearwardly from the front panel to the back of the set. The guide member has a rearwardly extending latching portion 30*a* which is engaged by a strap or latch, secured to the underside of the insulating panel, when the insulating panel is inserted in the grooves 18 and 19.

The bottom 15 of the radio has a series of slots 32 formed in its rear edge, and these slots receive a corresponding series of projections 33*a* of a rear panel 33. In this manner, the lower portion of the rear panel is supported in the slots. A supporting member 34 is formed on the side 14 and extends rearwardly from the front panel 11 almost to the back of the cabinet to form a pedestal for a plug 35, which is secured thereto by means of a screw 40. Plug 35 resiliently engages a receptacle 37 carried by the back panel whenever the back panel is in place, and receptacle 37 receives the power cord 36 of the receiver which is also supported by the back panel. Plug 35 and receptacle 37 form an electrical interlock arrangement so that the receiver is automatically deenergized whenever the rear panel is removed. The plug-receptacle combination 35, 37 also forms a resilient fastener for the top portion of rear panel 33. Power cord 36 is threaded or interleaved down the rear panel and emerges near the bottom, so that strain on this cord does not tend to bring the top portion of the panel away from plug 35, but is taken by the projections 33*a* in slots 32.

Figure 4:
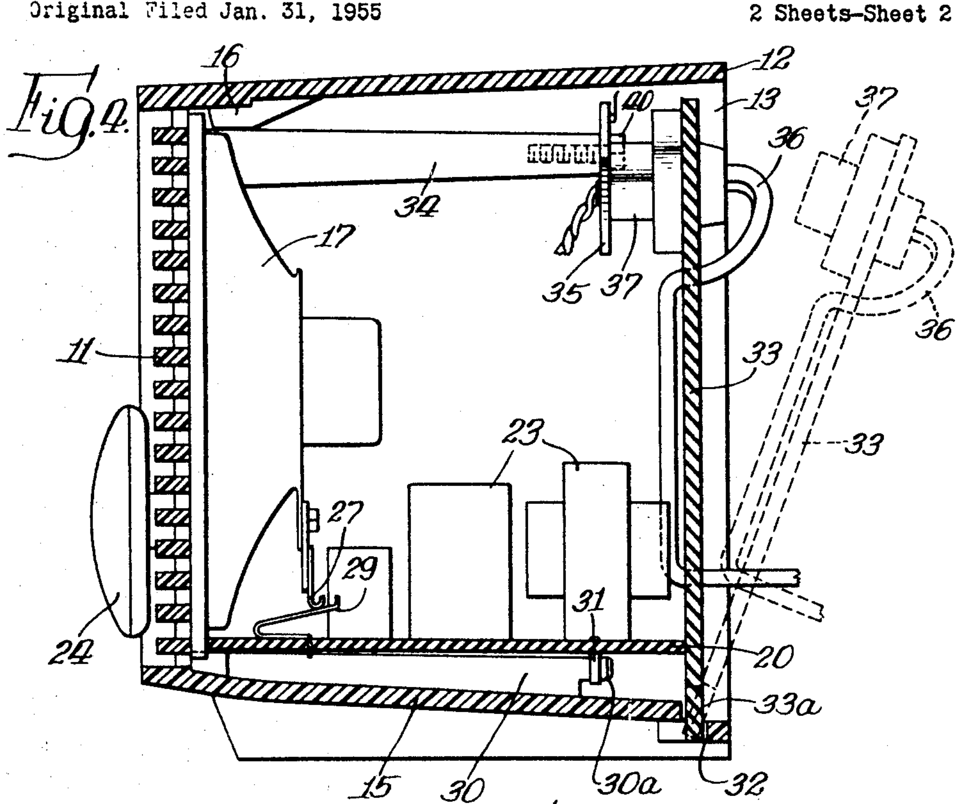
FIG. 4 is a sectional view taken along the lines 4—4 of FIG. 2.
Figure 5:
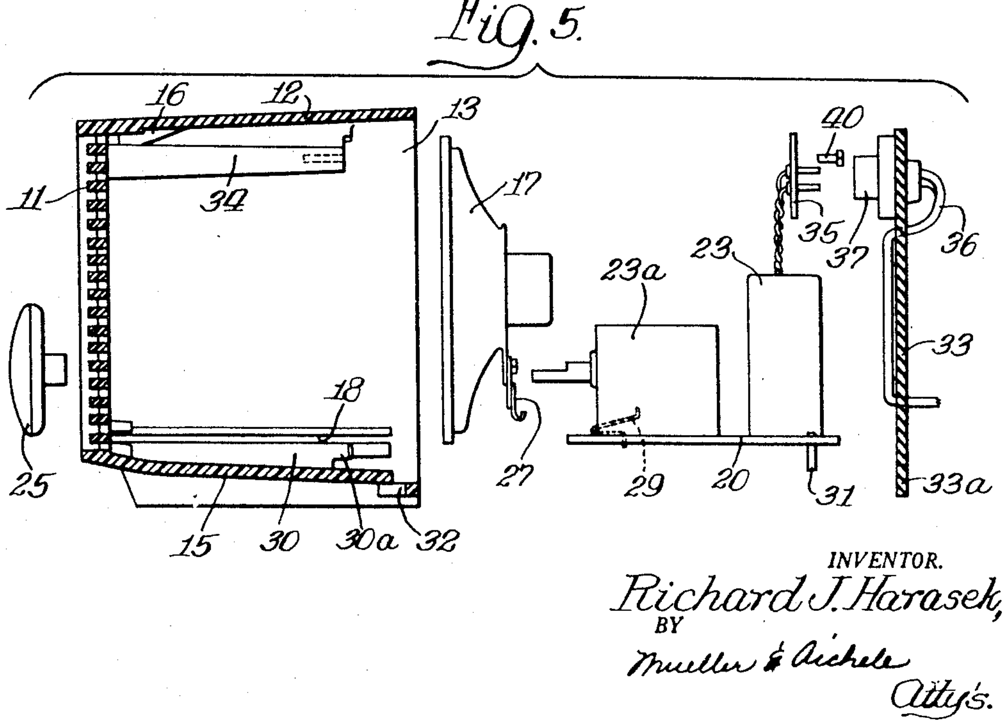
FIG. 5 is an exploded view of the radio receiver, partly in section.

The illustrated radio receiver which has just been described is extremely simple to assemble. Instead of requiring a multiplicity of screws or other fasteners, the receiver is put together merely by inserting the various components in the proper sequence, as shown in FIG. 5, so that one overlies the other. First, the speaker 17 is slipped under the dogs 16 and positioned between members 21 and 22. Then the plated circuit panel assembly is slipped into place in grooves 18 and 19 with the front edge of panel 20 engaging the lower rim of the speaker securely to support the speaker; and with the control shafts of the adjustable members, such as member 23*a*, extending through the front panel 11. When the panel assembly is in place, automatic electrical contact is made between the speaker contacts 26, 27 and contacts 28, 29. The strap or latch 31 engages the projecting portion 30*a* of guide member 30 firmly to hold the panel assembly against vertical movement, and guide 30 also assists in positioning speaker 17. Plug 35 is then secured to pedestal 34 by screw 40, and the rear panel 33 is swung into place in the manner shown in FIG. 4. Panel 33 usually carries an antenna to which appropriate connection is made. As previously noted, the rear panel 33 serves to retain the insulating panel 20 in place which, in turn, serves to retain the speaker. Knobs 24 and 25 are then slipped onto the control shafts of members 23*a* and the receiver is complete.

The invention provides, therefore, the new and improved radio receiver which may be assembled quickly and conveniently, and in which the various components are retained by a novel expedient that requires a minimum of fastening members.

I claim:

1. A radio receiver including in combination, a cabinet, a speaker separately inserted into and supported vertically within the cabinet, a horizontal plated circuit panel assembly separately inserted into and slidably supported within said cabinet, a pair of vertically extending electrical contacts connected to said speaker, and a corresponding pair of resilient electrical contacts carried on said panel assembly, each resilient contact adapted to fit under and make electrical connection with one of said vertical contacts when said panel assembly is inserted in position in said cabinet.

2. A radio receiver including in combination, a cabinet having a front panel, a speaker having a peripheral rim and vertically supported within said cabinet along said rim with said rim against said front panel, a flat, horizontal printed circuit panel supporting electronic components thereon and having a forward edge engaging said rim of said speaker and holding said speaker in place against said front panel, electrical contact means connected to said speaker and resilient electrical contact means connected to the circuitry on said panel and in contact with said contact means connected to said speaker to establish electrical connection between said speaker and said panel.

3. A radio receiver including in combination, a molded cabinet having a front panel and further having a pair of sides and a top and a bottom all extending rearwardly from said front panel, said cabinet having guides therein with grooves extending rearwardly thereacross from said front panel parallel to said bottom, a speaker having a peripheral rim disposed with said rim in facing, coacting relation with said front panel, means holding said rim against said front panel, a printed circuit panel assembly including a flat insulating panel supported in the respective grooves in said guides, a pair of contacts mounted on said speaker, a corresponding pair of resilient contacts carried on and extending above said insulating panel, each of said resilient contacts engaging a corresponding one of said pair of contacts on said speaker so as to establish electrical connection from said panel assembly to said speaker, a guide member formed in said bottom and extending parallel to each side rearwardly from said front panel, a rear panel, and means carried on said rear panel to serve as an electrical interlock for said receiver.

4. A radio receiver including in combination, a molded cabinet having a front panel, and further having a pair of sides and a top and a bottom all extending rearwardly from said front panel; said cabinet having a pair of spaced, aligned grooves therein extending rearwardly thereacross from said front panel adjacent and parallel to said bottom, at least one dog supported by one of the walls of said cabinet adjacent said front panel and spaced therefrom; a speaker disposed in facing, coacting relation with said front panel and having an upper rim extending between said dog and said front panel to be supported thereby; a plated circuit panel assembly including a flat insulating panel supported in said spaced, aligned grooves and having a forward edge engaging said speaker to hold said speaker in place against said front panel and further having a rearward edge; a pair of contacts mounted on said speaker; a corresponding pair of contacts mounted on said panel assembly and adapted to engage respective ones of said contacts on said speaker when said insulating panel is in place so as to establish electrical contact from said panel assembly to said speaker; a guide member formed in said bottom and extending parallel to said side rearwardly from said front panel; said guide member having a rearwardly extending latching portion; a latch member affixed to the underside of said insulating panel for engaging said latching portion of said guide member when said insulating panel is in place; said bottom having a series of slots therein adjacent the rear edge thereof; a rear panel having projections extending into said slots; said rear panel closing the rear of said cabinet for encasing said insulating panel; and means for fastening the upper portion of said rear panel to said cabinet.

5. A radio receiver including in combination, a molded cabinet having a front panel, and further having a pair of sides and a top and a bottom all extending rearwardly from said front panel; each of said sides having a groove therein extending rearwardly thereacross from said front panel adjacent and parallel to said bottom; at least one dog supported by said top adjacent said front panel and spaced therefrom; a speaker disposed in facing, coacting relation with said front panel and having an upper rim extending between said dog and said front panel to be supported thereby; a plated circuit panel assembly including a flat insulating panel supported in the respective grooves in said sides and having a forward edge engaging said speaker to hold said speaker in place against said front panel and further having a rearward edge; a pair of contacts mounted on said speaker; a corresponding pair of contacts mounted on said panel assembly and adapted to engage respective ones of said contacts on said speaker when said insulating panel is in place so as to establish electrical contact from said panel assembly to said speaker; a guide member formed in said bottom and extending parallel to said side rearwardly from said front panel; said guide member having a rearwardly extending latching portion; a latch member affixed to the underside of said insulating panel for engaging said latching portion of said guide member when said insulating panel is in place; said bottom having a series of slots therein adjacent the rear edge thereof; a rear panel having projections extending into said slots; said rear panel engaging a rear edge of said insulating panel to hold said panel in place; and means for fastening the upper portion of said rear panel to said cabinet.

6. A radio receiver such as defined in claim 5 in which said last mentioned means comprises a pair of resiliently mating contact members respectively supported in said cabinet and on said rear panel and serving additionally as an electrical interlock for said receiver.

7. A radio receiver such as defined in claim 6 in which said receiver includes a power line supported by said rear panel and connected to said contact member supported on said rear panel, said power line being interleaved with said rear panel to emerge at the bottom portion thereof so as to remove the strain from said resilient mating contact members.

8. A radio receiver including in combination, a molded cabinet having a front panel, and further having a pair of sides and a top and a bottom all extending rearwardly from said front panel; said cabinet having a pair of spaced, grooved guides extending rearwardly from said front panel with the grooves thereof parallel to said sides; at least one dog supported by said cabinet with a portion spaced from said front panel; a speaker disposed in facing, coacting relation with said front panel and having a rim retained by said portion of said dog; a plated circuit panel assembly including a flat insulating panel supported in the grooves of said guides and having a forward edge engaging said speaker remote from the engagement thereof with said dog to hold said speaker in place against said front panel; said bottom having a series of slots therein adjacent the rear edge thereof; a rear panel having projections extending into said slots; said rear panel closing the rear of said cabinet to encase said panel assembly and said speaker; and means for fastening the upper portion of said rear panel to said cabinet and for urging said panel assembly and said speaker toward said front panel.

9. A radio receiver including in combination, a molded cabinet having a front panel, and further having a pair of sides and a top and a bottom all extending rearwardly from said front panel; said cabinet having a pair of spaced, grooved guides extending rearwardly from said front panel with the grooves thereof parallel to said sides and spaced from said bottom; at least one dog supported by said cabinet with a portion spaced from said front panel; a speaker disposed in facing, coacting relation with said front panel and having an upper rim retained by said portion of said dog; a plated circuit panel assembly including a flat insulating panel supported in the grooves of said guides and having a forward edge engaging said speaker remote from the engagement thereof with said dog to hold said speaker in place against said front panel; a guide member formed in said bottom and extending parallel to said sides rearwardly from said front panel; said guide member having a rearwardly extending projection, a loop member affixed to the underside of said insulating panel for engaging said projection of said guide member when said insulating panel is in place; said bottom having a series of slots therein adjacent the rear edge thereof; a rear panel having projections extending into said slots; said rear panel closing the rear of said cabinet to encase said panel assembly and said speaker; and means for fastening the upper portion of said rear panel to said cabinet and for urging said panel assembly toward said front panel.

10. A radio receiver including in combination, a cabinet having a front panel and walls comprising a pair of sides and a top and bottom all extending rearwardly from said front panel; said cabinet further having a pair of spaced, grooved guides supported by said walls with the grooves therefor aligned to receive a plated circuit panel assembly therein with the forward edge of a panel assembly facing said front panel; a loudspeaker having a rim; a plurality of projections extending rearwardly from said front panel and spaced to engage the rim of said loudspeaker disposed in facing, coacting relation with said front panel; a plated circuit panel assembly including a flat insulating panel supported in the grooves of said guides; and fastening means adapted to be secured to said cabinet for urging said panel assembly and said loudspeaker toward said front panel and securing the same in fixed relation.

11. A molded cabinet for a radio receiver, said cabinet having a front panel and a pair of sides and a top and bottom all extending rearwardly from said front panel; said cabinet further having a pair of spaced, grooved guides extending rearwardly from said front panel with the grooves thereof parallel to said sides and spaced from said bottom to receive a plated circuit panel assembly in the grooves; at least one dog supported by said cabinet adjacent said top with a portion spaced from said front panel to receive an upper rim of a speaker disposed in facing, coacting relation with said front panel and with a lower rim thereof aligned with the grooves of said guides so that the panel of the plated circuit panel assembly may engage the speaker to hold the same in place against said front panel; guide means projecting rearwardly from said front panel in spaced relation for engaging the sides of a speaker retained in place against said front panel; a support portion formed in said bottom and extending parallel to said sides rearwardly from said panel for supporting the central portion of the panel assembly; and means adapted to be secured to said cabinet and to the panel assembly for urging the same toward said front panel and into engagement with the speaker.

12. A radio receiver including in combination, a cabinet having a front panel, and further having a pair of sides and a top and a bottom all extending rearwardly from said front panel; said cabinet having a pair of spaced, grooved guides extending rearwardly from said front panel with the grooves thereof parallel to said sides and spaced from said bottom; at least one dog supported by said cabinet with a portion spaced from said front panel; a speaker disposed in facing, coacting relation with said front panel with an upper rim retained by said portion of said dog; a plated circuit panel assembly including a flat insulating panel supported in the grooves of said guides and having a forward edge engaging said speaker remote from the engagement thereof with said dog to hold said speaker in place against said front panel; a support portion formed in said bottom and extending parallel to said sides rearwardly from said front panel for engaging and further supporting said panel assembly; means engaging said insulating panel and retaining the same upon said support portion of said bottom; and means urging said panel assembly toward said front panel and into engagement with said speaker.

13. A radio receiver including in combination, a cabinet having a front panel, and further having a pair of sides and a top and a bottom all extending rearwardly from said front panel; said cabinet having guides therein for supporting a panel assembly with an edge thereof facing said front panel; at least one dog supported by said cabinet with a portion spaced from said front panel; a speaker disposed in facing, coacting relation with said front panel with a rim thereof retained by said portion of said dog; a plated circuit panel assembly including a flat insulating panel supported by said guides and having a forward edge engaging said speaker remote from the engagement thereof with said dog to hold said speaker in place against said front panel; support means in said cabinet positioned to engage said insulating panel at the rear edge thereof for further supporting said panel assembly; and means urging said panel assembly toward said front panel and into engagement with said speaker.

14. A radio receiver including in combination, a cabinet having a front panel and walls comprising a pair of sides and a top and bottom all extending rearwardly from said front panel; said cabinet further having a pair of spaced, grooved guides supported by said walls with the grooves therefor aligned to receive a plated circuit panel assembly therein with the forward edge of a panel assembly facing said front panel; a loudspeaker having a rim; a plurality of projections extending rearwardly from said front panel and spaced to engage the rim of said loudspeaker disposed in facing, coacting relation with said front panel; a plated circuit panel assembly including a flat insulating panel supported in the grooves of said guides; a back panel having first line cord intercoupling portions affixed thereto, further line cord intercoupling portions secured within said cabinet, and removable fastening means for securing said back panel to said cabinet and for urging said panel assembly and said first line cord intercoupling portions toward said front panel.

15. A radio receiver including in combination, a cabinet having a front panel and walls comprising a pair of sides and a top and bottom all extending rearwardly from said front panel; said cabinet further having a pair of spaced, grooved guides supported by said walls with the grooves therefor aligned to receive a plated circuit panel assembly therein with the forward edge of a panel assembly facing said front panel; a loudspeaker having a rim; a plurality of projections extending rearwardly from said front panel and spaced to engage the rim of said loudspeaker disposed in facing, coacting relation with said front panel; a plated circuit panel assembly including a flat insulating panel supported in the grooves of said guides; one of said cabinet walls having a support ledge engageable with said panel assembly centrally thereof, and fastening means engaging a rearward portion of said panel assembly and adapted to be removably secured to said cabinet for urging said panel assembly toward said loudspeaker and said front panel.

References Cited in the file of this patent

UNITED STATES PATENTS

| | | |
|---|---|---|
| 2,514,246 | Knox | July 4, 1950 |
| 2,796,470 | Gossard | June 18, 1957 |
| 2,821,566 | Wiley | Jan. 28, 1958 |